US012642126B2

(12) United States Patent
Ye et al.

(10) Patent No.: US 12,642,126 B2
(45) Date of Patent: May 26, 2026

(54) SEMICONDUCTOR PACKAGE ENCAPSULANT WITH METAL ACTIVATED INORGANIC FILLER PARTICLES

(71) Applicant: Infineon Technologies AG, Neubiberg (DE)

(72) Inventors: Qun Ye, Singapore (SG); Stefan Schwab, Singapore (SG)

(73) Assignee: Infineon Technologies AG, Neubiberg (DE)

( * ) Notice: Subject to any disclaimer, the term of this patent is extended or adjusted under 35 U.S.C. 154(b) by 406 days.

(21) Appl. No.: 18/211,911

(22) Filed: Jun. 20, 2023

(65) Prior Publication Data

US 2023/0420319 A1      Dec. 28, 2023

(30) Foreign Application Priority Data

Jun. 24, 2022     (DE) ..................... 10 2022 115 817.9

(51) Int. Cl.
H10W 74/47          (2026.01)
H10W 72/00          (2026.01)
(Continued)

(52) U.S. Cl.
CPC ......... H10W 74/473 (2026.01); H10W 74/01 (2026.01); H10W 74/476 (2026.01);
(Continued)

(58) Field of Classification Search
CPC ....... H01L 23/564; H01L 24/48; H01L 21/56; H01L 23/295; H01L 23/296; H01L 24/32; H01L 24/73; H01L 24/06; H01L 23/3107;

H01L 23/3135; H01L 24/16; H01L 24/13; H01L 24/17; H01L 24/97; H01L 23/562; H01L 23/3114; H01L 21/561; H01L 23/5283; H01L 23/3128; H01L 24/09; H01L 23/291; H01L 21/565; H01L 2224/32225; H01L 2924/186; H01L 2224/48105; H01L 2224/06181; H01L 2224/48245; H01L 2224/48132; H01L 2224/48225; H01L 2224/32245; H01L 2224/48091; H01L 2224/73265; H01L 2224/85444; H01L 2224/45144; H01L 2224/48247; H01L 2924/181;
(Continued)

(56)      References Cited

U.S. PATENT DOCUMENTS 5,093,712  A      3/1992  Matsunaga et al.
11,282,757  B2      3/2022  Reither et al.
(Continued)

FOREIGN PATENT DOCUMENTS

CN          111534191          8/2020
DE      10 2017 121 485          3/2019
(Continued)

*Primary Examiner* — Mouloucoulaye Inoussa
(74) *Attorney, Agent, or Firm* — Dicke, Billig & Czaja, PLLC

(57)          ABSTRACT

A semiconductor package encapsulant is enclosed. In one example, the semiconductor package encapsulant is for at least partially encapsulating a semiconductor component, wherein the semiconductor package encapsulant comprises metal activated inorganic filler particles providing a corrosion protection function.

18 Claims, 3 Drawing Sheets

(51) Int. Cl.

| | |
|---|---|
| *H10W 72/50* | (2026.01) |
| *H10W 72/90* | (2026.01) |
| *H10W 74/01* | (2026.01) |
| *H10W 74/40* | (2026.01) |
| *H10W 90/00* | (2026.01) |

(52) U.S. Cl.

CPC .. *H10W 72/07554* (2026.01); *H10W 72/5453* (2026.01); *H10W 72/884* (2026.01); *H10W 72/944* (2026.01); *H10W 74/40* (2026.01); *H10W 90/734* (2026.01); *H10W 90/736* (2026.01); *H10W 90/754* (2026.01); *H10W 90/756* (2026.01)

(58) Field of Classification Search

CPC . H01L 2224/16245; H01L 2224/85205; H01L 2224/13101; H01L 2924/00014; H01L 2924/00012; H01L 2924/00015; H01L 2924/15311; H01L 2223/54406; H01L 2223/54433; H01L 2224/16227; H01L 2924/3511; H01L 2223/54486; H01L 2224/16225; H01L 2224/97; H01L 2924/3025; H01L 2223/54413; H01L 2924/15184; H01L 2224/81; H01M 4/36; H01M 4/1397; H01M 4/364; H01M 4/505; H01M 4/366; H01M 4/625; H01M 4/131; H01M 4/58; H01M 4/5825; H01M 4/525; H01M 2004/028; H01M 2004/021; H01M 10/0525; C01B 25/45; Y02E 60/10; C09D 183/06; C09D 127/12; C09D 5/08; C09D 183/04; C09D 7/63; C09D 127/20; C09D 7/20; C09D 7/65; C09D 123/22; B32B 27/283; B32B 27/08; B32B 27/304; B32B 2255/26; B32B 2307/7246; B32B 2250/24; B32B 2323/10; B32B 2307/752; B32B 2250/02; B32B 2327/18; B32B 2307/7265; B32B 2323/04; C08G 77/04; C08G 77/80; H10K 50/115; H10K 85/6572; H10K 85/324; H10K 85/60; H10K 50/125; H10K 85/381

See application file for complete search history.

(56) References Cited

U.S. PATENT DOCUMENTS

| | | | |
|---|---|---|---|
| 2003/0072962 A1 | 4/2003 | Matsuzaki et al. | |
| 2004/0224170 A1 | 11/2004 | Nakanishi et al. | |
| 2005/0147832 A1 | 7/2005 | Okai et al. | |
| 2012/0208043 A1 | 8/2012 | Matsuda et al. | |
| 2014/0225098 A1* | 8/2014 | Lee | G02B 5/0268 |
| | | | 257/40 |
| 2014/0228972 A1* | 8/2014 | Xu | A61L 31/148 |
| | | | 623/23.75 |
| 2015/0093589 A1* | 4/2015 | Mazyar | C22C 32/0036 |
| | | | 428/570 |
| 2020/0119298 A1* | 4/2020 | Kim | H10K 50/115 |
| 2020/0231800 A1* | 7/2020 | Roth | H01L 23/295 |
| 2021/0066638 A1* | 3/2021 | Park | H10K 50/17 |
| 2021/0108091 A1* | 4/2021 | Cunningham | C09D 183/06 |
| 2021/0335686 A1* | 10/2021 | Schwab | H01L 23/49548 |
| 2022/0275217 A1* | 9/2022 | Schwab | H01L 23/18 |
| 2024/0429371 A1* | 12/2024 | Xu | H01M 4/36 |

FOREIGN PATENT DOCUMENTS

| | | |
|---|---|---|
| DE | 10 2019 101 631 | 7/2020 |
| WO | 95/12647 | 5/1995 |

* cited by examiner

SEMICONDUCTOR PACKAGE ENCAPSULANT WITH METAL ACTIVATED INORGANIC FILLER PARTICLES

CROSS-REFERENCE TO RELATED APPLICATION

This Utility patent application claims priority to German Patent Application No. 10 2022 115 817.9 filed Jun. 24, 2022, which is incorporated herein by reference.

BACKGROUND

Technical Field

Various embodiments relate generally to a semiconductor package encapsulant, a semiconductor package, and a method of use.

Description of the Related Art

A conventional package may comprise a semiconductor component mounted on a carrier such as a leadframe structure, may be electrically connected by a bond wire extending from the semiconductor component to the carrier, and may be molded using a mold compound as an encapsulant.

Electric reliability of such a package may be an issue.

For these and other reasons, there may be a need for a package with high electric reliability.

SUMMARY

According to an exemplary embodiment, a semiconductor package encapsulant for at least partially encapsulating a semiconductor component is provided, wherein the semiconductor package encapsulant comprises metal activated inorganic filler particles providing a corrosion protection function.

According to another exemplary embodiment, a semiconductor package is provided which comprises at least one functional body including a semiconductor component, and a semiconductor package encapsulant having the above-mentioned features which at least partially encapsulates the at least one functional body and provides a corrosion protection function to the at least one functional body.

According to another exemplary embodiment, metal activated inorganic filler particles are used for providing a corrosion protection function in a semiconductor package.

According to an exemplary embodiment, an encapsulant (like a mold compound) configured for encapsulating a semiconductor component (such as a metallically interconnected semiconductor chip) of a semiconductor package is provided which comprises metal activated (preferably ion exchanged) inorganic filler particles. Advantageously, said metal activated inorganic filler particles may protect a metallic surface of a functional body (such as the semiconductor component (for instance a chip pad thereof), a metallic chip carrier and/or a metallic interconnection structure (such as a bond wire and/or a clip)) inside of the package for preventing or suppressing corrosion. To put it shortly, a surface metal of the mentioned metal activated inorganic filler particles may trap harmful ions (like protons, $H^+$, or chloride ions, $Cl^-$) inside of the encapsulant and may thereby deactivate them so that they can no longer cause corrosion. In addition, the interaction between the surface metal and the inorganic part of the metal activated inorganic filler particles with a metallic surface to be protected against corrosion may lead to the formation of complexes which may cover the metallic surface to be protected. Said coverage or coating may thereby function as an anticorrosive barrier inhibiting harmful ions from reaching the metallic surface of the functional body. Advantageously, such filler particles of a semiconductor package encapsulant may not only provide at least one dedicated filler particle function (such as adjusting chemical and/or physical properties of the encapsulant, for instance thermal conductivity, coefficient of thermal expansion, density, etc.), but may additionally provide an efficient anticorrosive function. As a result, electric reliability of a semiconductor package may be significantly improved substantially without additional effort, since filler particles may form part of a semiconductor package encapsulant anyhow.

BRIEF DESCRIPTION OF THE DRAWINGS

The accompanying drawings, which are included to provide a further understanding of exemplary embodiments and constitute a part of the specification, illustrate exemplary embodiments.

In the drawings.

DETAILED DESCRIPTION

Figure 1:
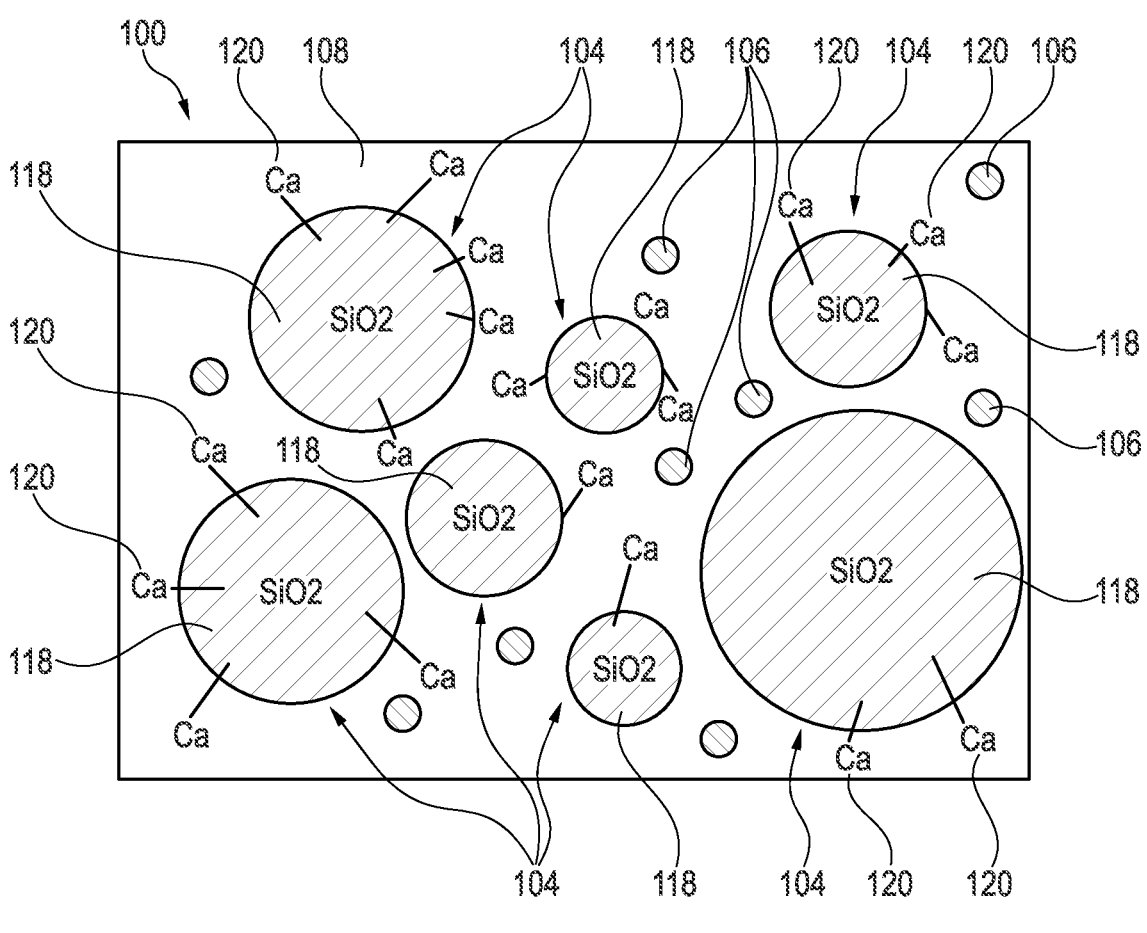
FIG. 1 illustrates a semiconductor package encapsulant according to an exemplary embodiment.

According to an exemplary embodiment, a semiconductor package encapsulant for at least partially encapsulating a semiconductor component is provided, wherein the semiconductor package encapsulant comprises metal activated inorganic filler particles providing a corrosion protection function.

According to another exemplary embodiment, a semiconductor package is provided which comprises at least one functional body including a semiconductor component, and a semiconductor package encapsulant having the above-mentioned features which at least partially encapsulates the at least one functional body and provides a corrosion protection function to the at least one functional body.

According to another exemplary embodiment, metal activated inorganic filler particles are used for providing a corrosion protection function in a semiconductor package.

According to an exemplary embodiment, an encapsulant (like a mold compound) configured for encapsulating a semiconductor component (such as a metallically interconnected semiconductor chip) of a semiconductor package is provided which comprises metal activated (preferably ion exchanged) inorganic filler particles. Advantageously, said metal activated inorganic filler particles may protect a metallic surface of a functional body (such as the semiconductor component (for instance a chip pad thereof), a metallic chip carrier and/or a metallic interconnection structure (such as a bond wire and/or a clip)) inside of the package for preventing or suppressing corrosion. To put it shortly, a surface metal of the mentioned metal activated inorganic filler particles may trap harmful ions (like protons, $H^+$, or chloride ions, $Cl^-$) inside of the encapsulant and may thereby deactivate them so that they can no longer cause corrosion. In addition, the interaction between the surface metal and the inorganic part of the metal activated inorganic filler particles with a metallic surface to be protected against corrosion may lead to the formation of complexes which may cover the metallic surface to be protected. Said coverage or coating may thereby function as an anticorrosive barrier inhibiting harmful ions from reaching the metallic surface of the functional body. Advantageously, such filler particles of a semiconductor package encapsulant may not only provide at least one dedicated filler particle function (such as adjusting chemical and/or physical properties of the encapsulant, for instance thermal conductivity, coefficient of thermal expansion, density, etc.), but may additionally provide an efficient anticorrosive function. As a result, electric reliability of a semiconductor package may be significantly improved substantially without additional effort, since filler particles may form part of a semiconductor package encapsulant anyhow.

In the following, further exemplary embodiments of the semiconductor package encapsulant, the semiconductor package, and the method of use will be explained.

In the context of the present application, the term "semiconductor package" may particularly denote an electronic device which may comprise one or more semiconductor components mounted on a carrier (such as a leadframe structure). Said constituents of the package may be encapsulated at least partially by an encapsulant. Optionally, one or more electrically conductive connection elements (such as metallic pillars, bumps, needles, bond wires and/or clips) may be implemented in a package, for instance for electrically coupling and/or mechanically supporting the semiconductor component.

In the context of the present application, the term "semiconductor component" may in particular encompass a semiconductor chip (in particular a power semiconductor chip), an active electronic device (such as a transistor), a passive electronic device (such as a capacitance or an inductance or an ohmic resistance), a sensor (such as a microphone, a light sensor or a gas sensor), an actuator (for instance a loudspeaker), and a microelectromechanical system (MEMS). However, in other embodiments, the semiconductor component may also be of different type, such as a mechatronic member, in particular a mechanical switch, etc. In particular, the semiconductor component may be a semiconductor chip having at least one integrated circuit element (such as a diode or a transistor) in a surface portion thereof. The semiconductor component may be a bare die or may be already packaged or encapsulated. Semiconductor chips implemented according to exemplary embodiments may be formed for example in silicon technology, gallium nitride technology, silicon carbide technology, etc.

In the context of the present application, the term "semiconductor package encapsulant" may particularly denote a substantially electrically insulating material configured for surrounding at least part of a semiconductor component and at least part of one or more electrically conductive structures to provide mechanical protection, electrical insulation, and optionally a contribution to heat removal during operation. In particular, said encapsulant may be a mold compound. A mold compound may comprise a matrix of flowable and hardenable material and filler particles embedded therein. For instance, filler particles may be used to adjust properties of the mold component. It is also possible that a semiconductor package encapsulant is a potting or casting compound.

In the context of the present application, the term "filler particles" may particularly denote a (in particular powderous or granulate-type) substance filling out interior volumes in a surrounding medium such as a matrix. By the selection of the filler particles, the physical and/or chemical properties of the encapsulant can be adjusted. Such properties may include the coefficient of thermal expansion, the thermal conductivity, the dielectric properties, etc. The filler particles may thus be added so as to fine tune the physical, chemical, etc., properties of the encapsulant. For instance, the filler particles may increase thermal conductivity of the encapsulant so as to efficiently remove heat out of an interior of an electronic device such as a package (such heat may be generated by a semiconductor component, for instance when embodied as power semiconductor chip). It is also possible that the filler particles provide an improved dielectric decoupling between such a semiconductor component and the surrounding of the package. Advantageously, filler particles according to exemplary embodiments may also provide an anticorrosive function.

In the context of the present application, the term "metal activated inorganic filler particles" may in particular denote filler particles of an encapsulant comprising (i) an inorganic core with (ii) active metal on a surface of the core. In particular, ion exchanged ceramic particles may be used as metal activated inorganic filler particles. Said inorganic compound may be a chemical compound that lacks carbon-hydrogen and/or or carbon-carbon bonds, that is, a compound that is not an organic compound. In a surface region of such an inorganic compound of a filler particle, active metals or metal ions may be provided having the capability of trapping ions (such as $H^+$, $Cl^-$, $Na^+$, etc.) inside of the encapsulant. Consequently, harmful corrosive ions can be trapped by the metal activated inorganic filler particles following an ion exchange mechanism, wherein metallic ions may be released upon ion exchange. In addition to its ion trapping function, some metal activated inorganic filler particles may additionally form compounds on a metallic surface of a functional body inside of an encapsulant. Thus, metallic ions can contribute to the formation of complexes or aggregates at a metal surface of a functional body to be protected against corrosion. This may lead to the formation of a protective layer on a metallic functional body protecting the metallic surface of the functional body against corrosion caused by harmful ions. This may be achieved by preventing penetration of the protective layer by harmful ions to the functional body surface. For instance, the inorganic part of the filler particles may comprise a ceramic such as silica (i.e. silicon oxide, $SiO_2$) and/or alumina (i.e. aluminum oxide, $Al_2O_3$). The active metal may be an alkaline earth metal such as calcium and/or magnesium. It is also possible that the active metal may be zinc, which also has a pronounced anticorrosive effect. While the organic compound may provide a primary filler function, such as an increase of thermal conductivity, the activated metal may additionally contribute to a secondary corrosion protection function. Apart from this, the complex formation property of a metal activated inorganic filler particle may be the result of a combination of the active metal and the inorganic core and may thereby provide an additional anticorrosion effect. As an example, calcium ion exchanged silica filler particles of an encapsulant covering an iron-containing functional body of a semiconductor package may result in a trapping of corrosive ions such as protons and may lead to the formation of a protective layer on the functional body comprising complexes of $CaSiO_3$ and $Fe_2(SiO_3)_3$. For manufacturing such metal activated inorganic filler particles (like calcium ion exchanged silica filler particles), an amorphous ceramic (such as silica) may be synthesized, as known as such by those skilled in the art. During said synthesis, active metal (such as calcium which may be provided in the form CaOH) may be mixed for triggering an exchange with the ceramic (in particular a silicon hydroxyl group) on the surface of ceramic (like amorphous silica). As a result, anti-corrosive metal activated inorganic filler particles (such as calcium ion exchanged silica filler particles) may be obtained.

In the context of the present application, the term "corrosion protection function" may in particular denote a technical effect provided by a certain composition of an encapsulant by which corrosion in an interior of a package is suppressed. Correspondingly, corrosion may denote a natural process that converts a metal into a more chemically stable metal oxide. In an interior of the package, corrosion may lead to a gradual destruction of metallic materials by chemical or electrochemical reactions with their environment. The provision of metal activated inorganic filler particles as a constituent of an encapsulant may suppress corrosion of one or more metallic functional bodies being covered by the encapsulant.

In the context of the present application, the term "functional body" may in particular denote any constituent or member of the semiconductor package contributing to the electronic function of the semiconductor package. A functional body may comprise a metallic surface to be protected against corrosion. Such a functional body may for instance be an encapsulated electronic component, such as a semiconductor chip, or a metallic surface portion thereof (such as a chip pad). Another example of a functional body is a metallic carrier carrying an electronic component, for instance a leadframe-type carrier, a die pad or a ceramic carrier coated with a metal on one or both opposing main surfaces thereof. Yet another example for a functional body is an electrically conductive connection element, such as a clip or a bond wire, used for connecting a semiconductor component with a carrier.

In an embodiment, the semiconductor package encapsulant further comprises other filler particles providing at least one other function differing from said corrosion protection function. Hence, at least two different types of filler particles may form part of the semiconductor package encapsulant. A first type of said filler particles may be the above described metal activated inorganic filler particles providing a filler function and an anticorrosion function. In addition, a second type of filler particles of the encapsulant does not provide an anticorrosion function, but may provide another filler function (such as adjustment of the coefficient of thermal expansion, enhancement of thermal conductivity, etc.). Thus, a proper mixture of different kinds of filler particles may be provided which may be freely engineered to comply with the requirements of certain semiconductor package application.

In another embodiment, the semiconductor package encapsulant is free of other filler particles. In such an embodiment, all filler particles of the encapsulant may be metal activated inorganic filler particles of the above described type and function. While the inorganic core may provide a base function (for instance a thermal function), the active surface metal (in particular in combination with the inorganic core) may provide an anticorrosion function.

In an embodiment, a weight ratio between the metal activated inorganic filler particles and the other filler particles is in a range from 1:5 to 5:1. Thus, the ratio between the amounts of the metal activated inorganic filler particles and the other filler particles may be varied over a broad range. This may allow to freely fine-tune the filler particle functions in accordance with the specific needs of a certain packaging application.

In an embodiment, a percentage by weight of a sum of the metal activated inorganic filler particles and the other filler particles, in relation to an entire weight of the semiconductor package encapsulant, is in a range from 70 weight percent to 90 weight percent. Thus, the filler particles may form a major or main constituent of the semiconductor package encapsulant, so that the encapsulant function may be dominated by the freely selectable filler composition. Consequently, filler properties may have a large impact on the semiconductor package functionality, in particular reliability.

In an embodiment, the at least one other function comprises at least one of the group consisting of a moisture adsorption characteristic, a reduction of a coefficient of thermal expansion (CTE), a reduction of density, an enhancement of a high voltage capability, and an increase of thermal conductivity. For instance, inorganic material (such as silica) may have an impact on the moisture adsorption characteristic in an interior of the semiconductor package and may thereby contribute to the electric reliability. By reducing an overall CTE value of the encapsulant, filler particles may also improve the thermal reliability by reducing thermal stress. Also an increase of the thermal conductivity of the semiconductor package encapsulant material by a corresponding selection of the filler particles may enhance thermal reliability, since this may improve the heat removal capability.

In an embodiment, the semiconductor package encapsulant is configured as a mold compound, in particular as an epoxy-based mold compound. Molding may denote a manufacturing process of shaping liquid or pliable raw material using a rigid tool called a mold. Hence, encapsulation of the one or more semiconductor components of the semiconductor package may be accomplished by molding. Consequently, the encapsulant may comprise a curable matrix (for instance on the basis of epoxy resin) with filler particles (for fine-tuning encapsulant functions) therein. By implementing metal activated inorganic filler particles in the mold compound, a further improved electric reliability of the obtained molded semiconductor package may be achieved.

In another embodiment, the semiconductor package encapsulant is configured as a potting compound, in particular as a silicone gel-based compound. In particular, potting may denote a process of filling an electronic assembly with a solid or gelatinous compound, for example for high voltage assemblies. This may suppress or exclude gaseous phenomena such as corona discharge, may be done for resistance to shock and vibration, and/or may be executed for the exclusion of water, moisture, etc. When embedding metal activated inorganic filler particles in a potting compound, electric reliability of the obtained encapsulated semiconductor package may be further improved thanks to the additionally provided corrosion protection function.

In an embodiment, the semiconductor package encapsulant comprises a matrix in which the metal activated inorganic filler particles (and optionally the further filler particles, if present) are embedded. Such a matrix may comprise a resin, in particular a polymer resin. For example, such a polymer resin may be an epoxy resin. For instance, the matrix may be made of a curable material such as epoxy resin which may be hardened during an encapsulation process. The filler particles inside of said matrix may fine-tune the semiconductor package properties and may protect the semiconductor package against corrosion.

In an embodiment, a percentage by weight of the metal activated inorganic filler particles, in relation to an entire weight of the semiconductor package encapsulant, is at least 4 weight percent, preferably at least 10 weight percent. Advantageously, the metal activated inorganic filler particles can be added substantially in any desired amount in the encapsulant without strict limitation. Thus, a highly pronounced corrosion protection may be achieved.

In an embodiment, a percentage by weight of the metal activated inorganic filler particles, in relation to an entire weight of the semiconductor package encapsulant, is not more than 90 weight percent, in particular not more than 80 weight percent. The rest of the weight of the encapsulant may then be contributed by a curable matrix (such as hardenable resin), optionally additional filler particles of another type, and further optionally other additives for refining the encapsulant functions.

In an embodiment, the metal activated inorganic filler particles comprise an inorganic ceramic. In particular, technical ceramics such as $SiO_2$, $ZrO_2$, $Al_2O_3$, SiC and $Si_3N_4$ may be used as a basis for the filler particles. Such materials may not only provide desired thermal properties (such as a relatively high thermal conductivity and a relatively low coefficient of thermal expansion), but may also provide a suitable moisture-adsorption characteristics. When being synthesized as metal activated ceramic filler particles, they may also provide an anticorrosion function.

In an embodiment, the metal activated inorganic filler particles comprise an inorganic material selected from silica and alumina. Most preferred may be silica in view of its excellent properties as basis for ion exchanged metal.

In an embodiment, the metal activated inorganic filler particles comprise an alkaline earth metal. The alkaline earth metals are the chemical elements in group 2 of the periodic table and have turned out to be particularly advantageous for forming metal activated inorganic filler particles. Most preferred is calcium, wherein magnesium is also an appropriate choice. In another embodiment, the metal activated inorganic filler particles may also comprise another type of anticorrosive metal, preferably zinc.

In a preferred embodiment, the metal activated inorganic filler particles comprise or consist of calcium exchanged silica. Calcium exchanged silica has turned out to meet perfectly the requirements of semiconductor packaging for manufacturing molding or potting compounds for encapsulating semiconductor chips.

In an embodiment, the metal activated inorganic filler particles are configured for trapping ions by an ion exchange mechanism. When harmful ions, such as protons or chloride ions, enter into the encapsulant and approach a package semiconductor component an interaction between the metal activated inorganic filler particles and said ions may neutralize the latter, so that the ions may be deactivated concerning their undesired corrosive capability.

In an embodiment, the metal activated inorganic filler particles are configured as flocculating agent by forming aggregates. Descriptively speaking, a chemical reaction involving metal activated inorganic filler particles, ions to be neutralized, and a metallic surface of a functional body inside of a semiconductor package encapsulant may form complexes which may coat the metallic surface to be protected against corrosion. Such a protective layer on the metallic surface (for instance a chip pad, a chip carrier, a metallic connection element, etc.) may provide an additional corrosion protection for the functional body.

In an embodiment, the metal activated inorganic filler particles comprise an inorganic core (preferably silica) and metal ions or atoms on the inorganic core. By arranging the metal on the surface, the capability of trapping undesired ions may be enhanced.

In an embodiment, the at least one functional body further includes at least one of the group consisting of a carrier carrying the semiconductor component, and an electrically conductive connection element connecting the semiconductor component, in particular a clip and/or a bond wire.

In the context of the present application, the term "carrier" may particularly denote a support structure (which may be at least partially electrically conductive) which serves as a mechanical support for the semiconductor component(s) to be mounted thereon, and which may also contribute to the electric interconnection between the semiconductor component(s) and the periphery of the package. In other words, the carrier may fulfil a mechanical support function and an electric connection function. A carrier may comprise or consist of a single part, multiple parts joined via encapsulation or other package components, or a subassembly of carriers. For example, the carrier is a metal plate or forms part of a leadframe. However, it is also possible that the carrier comprises a stack composed of a central electrically insulating and thermally conductive layer (such as a ceramic layer) covered on both opposing main surfaces by a respective electrically conductive layer (such as a copper layer or an aluminium layer, wherein the respective electrically conductive layer may be a continuous or a patterned layer). In particular, the carrier may be a Direct Copper Bonding (DCB) substrate or a Direct Aluminium Bonding (DAB) substrate. However, the carrier may also be configured as Active Metal Brazing (AMB) substrate, or as patterned metal plate (for example a leadframe).

In an embodiment, the at least one functional body comprises an electrically conductive connection element electrically coupling the semiconductor component with the carrier. Such an electrically conductive connection element may be a clip, a bond wire or a bond ribbon. A clip may be a curved electrically conductive body accomplishing an electric connection with a high connection area to an upper main surface of a respective semiconductor component. Additionally or alternatively to such a clip, it is also possible to implement one or more other electrically conductive interconnect bodies in the package, for instance a bond wire and/or a bond ribbon connecting the semiconductor component with the carrier or connecting different pads of a semiconductor component.

Also one or more pads of the semiconductor component may be a functional body being protected against corrosion by the metal activated inorganic filler particles.

In an embodiment, the method comprises using the metal activated inorganic filler particles in a semiconductor package encapsulant for at least partially encapsulating a semiconductor component in the semiconductor package. Advantageously, a proper adhesion may be achieved between such a semiconductor package encapsulant and the encapsulated semiconductor package.

In an embodiment, at least part of said filler particles has a shape of a group consisting of beads, plates, fibers, solid spheres, hollow spheres, tubes, and multi-tubes. However, any other shape and/or any combination of the mentioned and/or other shapes of the filler particles may be possible as well.

In an embodiment, the filler particle has a hollow core. For instance, at least some of the filler particles may be spheres with an interior macroscopic hole. Such a configuration may for instance be advantageous when a low weight of the composite material is desired.

In another embodiment, the filler particle has a void-free core. Such filler particles with dense or solid core without macroscopic interior holes may provide a particularly pronounced particle function, for instance an efficient increase of the thermal conductivity of the composite in comparison with the absence of filler particles.

In an embodiment, different ones of the filler particles are directly physically connected with each other. In another embodiment, they are separate from each other.

In an embodiment, the filler particles (for instance all or at least 80% or at least 90% of the filler particles) have a diameter in a range from 10 nm to 10 μm, in particular in a range from 20 nm to 5 μm, more particularly in a range from 50 nm to 3 μm. In an embodiment, even larger filler particles can be in the composite, in particular when used as mold compound. Thus, filler particles in a mold compound-type composite may be even larger, for instance up to 140 μm. Thus, there can be larger filler particles in the resin. It is however possible to use mixtures with filler particles that are smaller down to the values listed above.

In an embodiment, the filler particles have a homogeneous diameter. In other words, different filler particles may all have essentially the same dimensions. Alternatively and preferably, the filler particles may however have a diameter distribution.

In an embodiment, filler particles are selected from a group consisting of crystalline silica, fused silica, spherical silica, titanium oxide, aluminium hydroxide, magnesium hydroxide, zirconium dioxide, calcium carbonate, calcium silicate, talc, clay, carbon fiber, glass fiber and mixtures thereof. Other filler materials are however possible depending on the demands of a certain application. Filler particles (for example Sift, $Al_2O_3$, $Si_3N_4$, BN, AlN, diamond, etc.), for instance for improving thermal conductivity may be used as well. In particular, organic particles may be used as fillers (for instance, fillers can also comprise or consist of polymers or polymer mixtures, such as: epoxies, polyethylene, polypropylene, etc.). In particular, filler particles may be provided as nanoparticles or microparticles. Filler particles may have identical dimensions or may be provided with a distribution of particle sizes. Such a particle size distribution may be preferred since it may allow for an improved filling of gaps in an interior of the encapsulant. For instance, the shape of the filler particles may be randomly, spherical, cuboid-like, flake-like, and film-like. The filler particles can be modified, coated, and/or treated as to improve the adhesion and/or the chemical binding to the surrounding matrix. Examples are silanes. A coating can also change the surface energy of the fillers and may thereby improve and enable the wetting of the solution/the matrix.

In an embodiment, the package is configured as one of the group consisting of a leadframe connected power module, a Transistor Outline (TO) package, a Quad Flat No Leads Package (QFN) package, a Small Outline (SO) package, a Small Outline Transistor (SOT) package, and a Thin Small Outline Package (TSOP) package. Also packages for sensors and/or mechatronic devices are possible embodiments. Moreover, exemplary embodiments may also relate to packages functioning as nano-batteries or nano-fuel cells or other devices with chemical, mechanical, optical and/or magnetic actuators. Therefore, the package according to an exemplary embodiment is fully compatible with standard packaging concepts (in particular fully compatible with standard TO packaging concepts) and appears externally as a conventional package, which is highly user-convenient.

In an embodiment, the package is configured as power module, for instance molded power module such as a semiconductor power package. For instance, an exemplary embodiment of the package may be an intelligent power module (IPM). Another exemplary embodiment of the package is a dual inline package (DIP).

In an embodiment, the semiconductor component is configured as a power semiconductor chip. Thus, the semiconductor component (such as a semiconductor chip) may be used for power applications for instance in the automotive field and may for instance have at least one integrated insulated-gate bipolar transistor (IGBT) and/or at least one transistor of another type (such as a MOSFET, a JFET, etc.) and/or at least one integrated diode. Such integrated circuit elements may be made for instance in silicon technology or based on wide-bandgap semiconductors (such as silicon carbide). A semiconductor power chip may comprise one or more field effect transistors, diodes, inverter circuits, half-bridges, full-bridges, drivers, logic circuits, further devices, etc.

In an embodiment, the package comprises a plurality of semiconductor components encapsulated by the semiconductor package encapsulant. Thus, the package may comprise one or more semiconductor components (for instance at least one passive component, such as a capacitor, and at least one active component).

As substrate or wafer forming the basis of the semiconductor components, a semiconductor substrate, in particular a silicon substrate, may be used. Alternatively, a silicon oxide or another insulator substrate may be provided. It is also possible to implement a germanium substrate or a III-V-semiconductor material. For instance, exemplary embodiments may be implemented in GaN or SiC technology.

The above and other objects, features and advantages will become apparent from the following description and the appended claims, taken in conjunction with the accompanying drawings, in which like parts or elements are denoted by like reference numbers.

The illustration in the drawing is schematically and not to scale.

Before exemplary embodiments will be described in more detail referring to the figures, some general considerations will be summarized based on which exemplary embodiments have been developed.

Corrosion is a challenge for plastics packages of semiconductor components. The phenomenon of corrosion is related to harmful ions and elements which may occur in a semiconductor package, for example, $H^+$, $Na^+$, $Cl^-$, $OH^-$, etc. Conventional ways to solve ion related corrosion issues include the addition of ion catchers to mitigate the harmful ions. However, ion catchers typically work in an ion exchange mechanism and are either inefficient or cause unwanted ions released.

According to an exemplary embodiment, a semiconductor package encapsulant is provided which comprises metal activated inorganic filler particles. The latter may provide a corrosion protection function to any metallic surface of an encapsulated semiconductor component and/or a further functional body connected therewith and having a metallic surface. More specifically, an exemplary embodiment provides metal activated inorganic filler particles as corrosion protective pigments for a semiconductor package encapsulant, such as a molding compound. This may increase electric reliability of the semiconductor package. In particular, the implementation of metal activated inorganic filler particles in a semiconductor package encapsulant may increase the lifetime of the semiconductor package. Consequently, carbon dioxide emission associated with the production and maintenance of the semiconductor package can be reduced. Advantageously, metal activated inorganic filler particles may provide a highly efficient corrosion protection function and do not cause unwanted ions released.

More specifically, a gist of an exemplary embodiment is the use of metal activated inorganic filler particles, preferably calcium exchanged silica, as a beneficial additive in a semiconductor package encapsulant, such as an epoxy molding compound. Advantageously, this may allow to solve harmful ions ($H^+$, $Cl^-$, $Na^+$, etc.) related corrosion issues in a semiconductor package. Preferably, calcium exchanged silica may be utilized as an anticorrosion additive of a semiconductor package encapsulant.

Firstly, harmful ions (such as protons) can be trapped in the ion exchanged silica following an ion exchange mechanism. Calcium ions may be released upon ion exchange.

Secondly, calcium ions can additionally function as a flocculating agent to form aggregates at a metal surface to be protected against corrosion. This can lead to the formation of a protective layer at the metal surface to prevent the penetration of other harmful ions such as $Cl^-$.

Advantageously, cation exchanged silica has turned out as properly compatible with an epoxy molding compound application, as silica can be used in large amount for filler particles for molding compound applications. Replacement of at least part of conventional filler silica with ion exchanged silica can provide a beneficial effect to reduce the concentration of harmful ions and to form protective layers at the metal surface for further corrosion protection.

Advantageously, calcium exchanged silica is commercially available as such and can be manufactured in a simple and efficient way in an electronically pure grade. One of the main advantages to use such metal activated inorganic filler particles for epoxy mold compound applications is that the filler content for epoxy mold compounds can be very high, which results in a high concentration of anti-corrosive species in the epoxy mold compound when being equipped with metal activated inorganic filler particles. In addition, the process can be used as a filler treatment of a conventional epoxy mold compound filler prior to manufacturing of the epoxy mold compound. That way, the impact of the overall properties of the proximal compound (for example mold performance, gel time, spiral flow, modulus, etc.) should not be changed significantly by the modification. In addition, the use of such a technology in mold compounds may omit the use of other ion catchers, which can simplify the formulation of a semiconductor package encapsulant.

Another embodiment may use such metal activated inorganic filler particles in silicone gels (for instance for power modules). This way, Ca-activated silicon can also reduce the risk of corrosion for metals. For instance, metal activated inorganic filler particles (in particular ion exchanged silica filler) may be used advantageously in gels.

Advantageously, exemplary embodiments may strongly suppress corrosion effects and high temperature reverse bias (HTRB) issues in semiconductor packages, in particular high voltage semiconductor packages. Exemplary embodiments can lead to an improvement of epoxy mold compounds with minimal impact of the overall properties of the mold compound. Descriptively speaking, metal activated inorganic filler particles may be produced by a simple filler treatment rather than a change of formulation.

Stability against corrosion is in particular advantageous for high reliability standards for high temperature and high voltage semiconductor packages. Also, it may become possible to withstand higher electrical fields, which may be of utmost advantage for example for SiC and GaN devices (smaller package outline with higher voltage).

The provision of a semiconductor package encapsulant with metal activated inorganic filler particles may improve the long term performance of the corresponding semiconductor package. The overall failure rate and lifetime of a semiconductor package may be improved by adopting the encapsulation, as described. In comparison with conventional ion catchers, the integration of metal activated inorganic filler particles in a semiconductor package encapsulant may reduce undesired side effects (such as inadequate water uptake and poor mechanical properties) so that conventional limits of a maximum amount of corrosion suppression may be overcome. In other words, metal activated inorganic filler particles may be inserted with much higher amount in a semiconductor package encapsulant. Hence, the implementation of metal activated inorganic filler particles may function as an anticorrosion additive while at the same time providing a filler function (such as a reduction of water uptake, a reduction of the coefficient of thermal expansion, weight reduction, enhancement of high-voltage capability, etc.). Descriptively speaking, the addition of metal activated inorganic filler particles in a semiconductor package encapsulant may add the function of a corrosion inhibitor without a significant increase of composition complexity.

Advantageously, calcium-activation of silica-based filler particles may be executed prior to the formation of the semiconductor package encapsulant. Thus, a calcium-activated silica-based filler may be obtained prior to epoxy mold compound manufacture. This can be done for the whole filler or just for some of multiple filler cuts. Such a calcium-activated filler can be used as silica coating. For preparation of metal activated inorganic filler particles according to exemplary embodiments, a solution-based ion exchange may be executed, and hydrothermal aging may be carried out as well. In an epoxy mold compound formulation, the amount of the metal activated inorganic filler particles may be freely selected for instance in a range from 1 to 92 weight percent, in relation to the entire weight of the encapsulant. Advantageously, a pronounced anticorrosion effect may be obtained without significantly changing the properties of the semiconductor package encapsulant.

FIG. 1 illustrates a semiconductor package encapsulant 100 according to an exemplary embodiment.

Figures 3, 4:
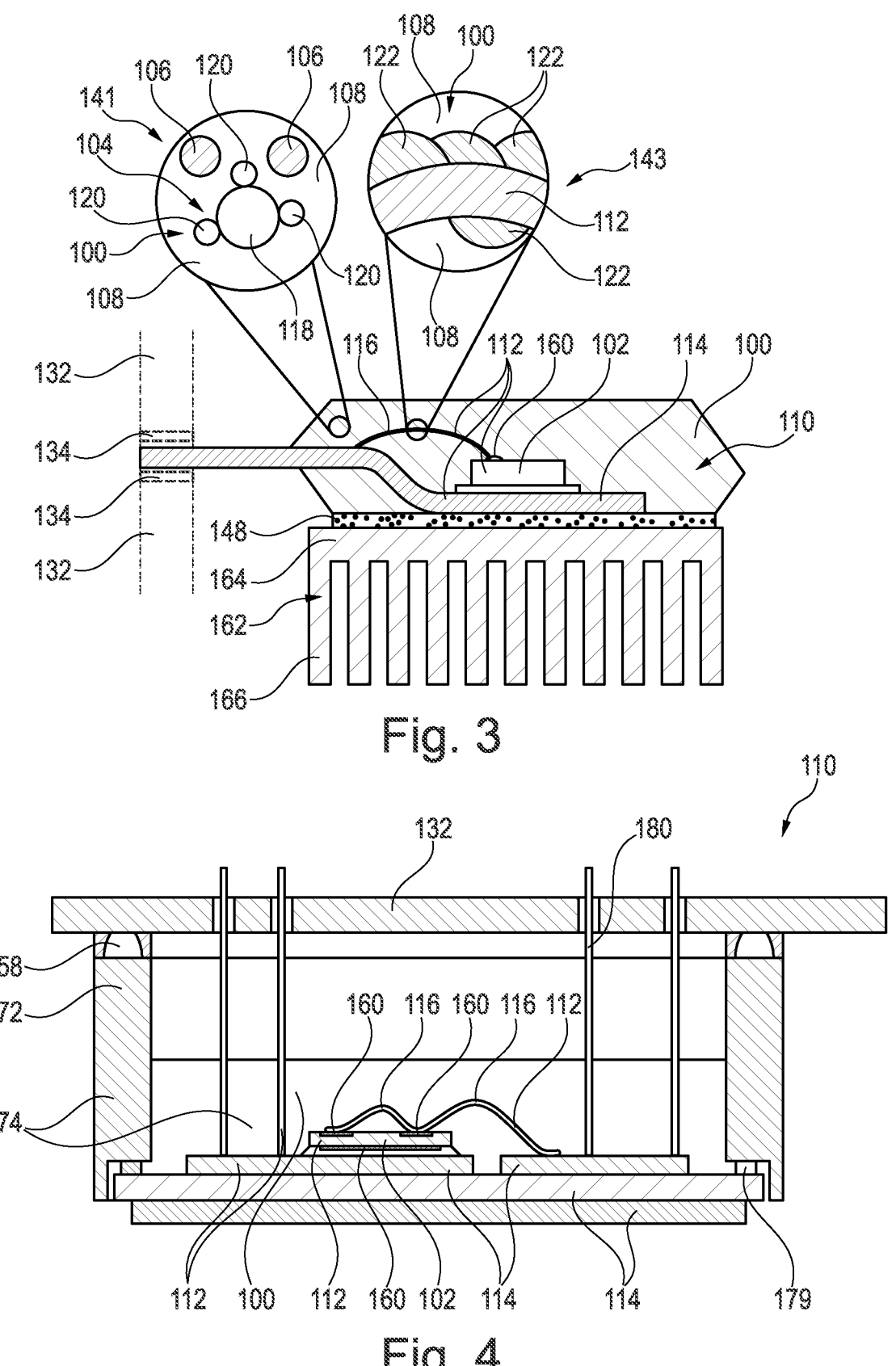
FIG. 3 illustrates a cross-sectional view of a semiconductor package according to an exemplary embodiment.
FIG. 4 illustrates a cross-sectional view of a semiconductor package according to another exemplary embodiment.

The illustrated semiconductor package encapsulant 100 may be used for partially or entirely encapsulating a semiconductor component 102, as shown in FIG. 3 or FIG. 4. Advantageously, the semiconductor package encapsulant 100 comprises metal activated inorganic filler particles 104 providing a corrosion protection function for protecting metallic surfaces of the semiconductor component 102 and/or other encapsulated metallic surfaces against corrosion.

As shown in FIG. 1, the semiconductor package encapsulant 100 may further comprise one more other types of filler particles 106 providing one or more other functions differing from said corrosion protection function provided by the metal activated inorganic filler particles 104. This may allow to fine-tune the functionality of the semiconductor package encapsulant 100. Although not shown, the semiconductor package encapsulant 100 may be alternatively free of other filler particles 106, i.e. may comprise only filler particles in form of the metal activated inorganic filler particles 104. This may allow to simplify the manufacture of the semiconductor package encapsulant 100.

Again referring to FIG. 1, a weight ratio between the metal activated inorganic filler particles 104 and the other filler particles 106 (if present) may be freely selected in a range from 1:5 to 5:1. Since no negative side effects occur by the metal activated inorganic filler particles 104, conventional limits of ion catchers with undesired side effects may be overcome.

For example, a percentage by weight of a sum of the metal activated inorganic filler particles 104 and the other filler particles 106, in relation to an entire weight of the semiconductor package encapsulant 100, may be 80 weight percent. This may allow to obtain a strong anticorrosion function in combination with advantageous properties in terms of adsorption of moisture, a reduction of an overall coefficient of thermal expansion of the semiconductor package encapsulant 100, and an increase of thermal conductivity of the semiconductor package 100 as a whole.

Depending on the requirements of a certain application, it is for instance possible to embody the semiconductor package encapsulant 100 as an epoxy-based mold compound (as in FIG. 3), or as a silicone gel-based potting compound (as in FIG. 4).

As shown in FIG. 1, the semiconductor package encapsulant 100 comprises a matrix 108 in which the metal activated inorganic filler particles 104 and the further filler particles 106 are embedded.

For instance, the matrix 108 comprises an epoxy resin or another polymer matrix. During an encapsulation process, the epoxy resin may be cured and may thereby be hardened.

Furthermore, the metal activated inorganic filler particles 104 comprise an inorganic ceramic core, preferably made from silica ($SiO_2$). At an exterior surface of the inorganic ceramic core, the metal activated inorganic filler particles 104 comprise an alkaline earth metal, preferably calcium. Thus, a preferred embodiment of the metal activated inorganic filler particles 104 is calcium exchanged silica. As shown, the metal activated inorganic filler particles 104 comprise inorganic core 118 of silica and metal ions 120 (or metal in another form) of calcium on the inorganic core 118.

The described composition of the semiconductor package encapsulant 100 has advantageous effects: Due to the calcium at the exterior surface, the metal activated inorganic filler particles 104 are configured for trapping corrosive ions (such as protons or chloride ions) by an ion exchange mechanism.

Furthermore, the metal activated inorganic filler particles 104, when interacting with a metallic surface to be protected against corrosion, are configured as flocculating agent forming aggregates 122 (see FIG. 3). More specifically, calcium ion exchanged silica filler particles of semiconductor package encapsulant 100 covering an iron-containing functional body of a semiconductor package 102 may lead to the formation of a protective layer on the functional body comprising complexes of $CaSiO_3$ and $Fe_2(SiO_3)_3$. This may protect the metallic surface against corrosive ions.

Although not entirely shown in FIG. 1, the semiconductor package encapsulant 100 may comprise a plurality of constituents, such as resin, hardener, flame retardant, adhesion promoter, low stress additive (LSA), wax, etc. In particular, one or more further additives may be added as well to the semiconductor package encapsulant 100 for adjusting its functions and properties.

Figure 2:
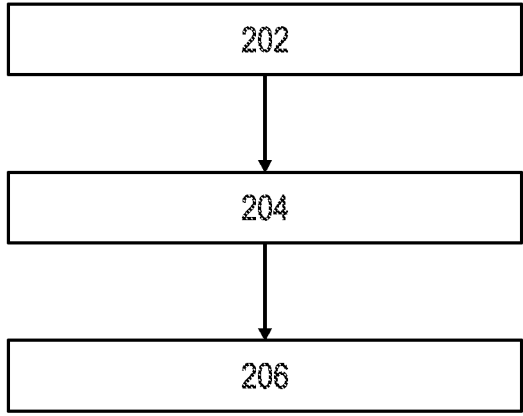
FIG. 2 illustrates a flowchart of a method of manufacturing a semiconductor package encapsulant according to an exemplary embodiment.

FIG. 2 illustrates a flowchart 200 of a method of manufacturing a semiconductor package encapsulant 100 according to an exemplary embodiment. The reference signs used for the following description of said manufacturing method relate to the embodiments of FIG. 1 and FIG. 3.

Referring to a block 202, the method comprises providing at least one functional body 112 including a semiconductor component 102.

Referring to a block 204, the method furthermore comprises forming a semiconductor package encapsulant 100 at least partially encapsulating the at least one functional body 112.

Referring to a block 206, the method additionally comprises providing a corrosion protection function to the at least one functional body 112 by embedding metal activated inorganic filler particles 104 in the semiconductor package encapsulant 100.

FIG. 3 illustrates a cross-sectional view of a molded semiconductor package 110 according to an exemplary embodiment.

The semiconductor package 110 is mounted on a mounting structure 132, here embodied as printed circuit board.

The mounting structure 132 comprises an electric contact 134 embodied as a plating in a through hole of the mounting structure 132. When the semiconductor package 110 is mounted on the mounting structure 132, a semiconductor component 102 of the semiconductor package 110 is electrically connected to the electric contact 134 via an electrically conductive carrier 114, here embodied as a leadframe made of copper.

The semiconductor package 110 thus comprises the electrically conductive carrier 114, the semiconductor component 102 (which is here embodied as a power semiconductor chip) mounted on the carrier 114, and an encapsulant 100 encapsulating part of the carrier 114 and the semiconductor component 102.

As can be taken from FIG. 3, a pad 160 on an upper main surface of the semiconductor component 102 is electrically coupled to the carrier 114 via a bond wire as electrically conductive connection element 116. Alternatively, a clip may be used as electrically conductive connection element 116 (not shown).

Reference signs 102, 114, 116 show different functional bodies 112 of the semiconductor package 110.

During operation of the power semiconductor package 110, the power semiconductor chip in form of the semiconductor component 102 generates a considerable amount of heat. At the same time, it shall be ensured that any undesired current flow between a bottom surface of the semiconductor package 110 and an environment is reliably avoided.

For ensuring electrical insulation of the semiconductor component 102 and removing heat from an interior of the semiconductor component 102 towards an environment, an electrically insulating and thermally conductive interface structure 148 may be provided which covers an exposed surface portion of the carrier 114 and a connected surface portion of the encapsulant 100 at the bottom of the semiconductor package 110. The electrically insulating property of the interface structure 148 prevents undesired current flow even in the presence of high voltages between an interior and an exterior of the semiconductor package 110. The thermally conductive property of the interface structure 148 promotes a removal of heat from the semiconductor component 102, via the electrically conductive carrier 114 (of thermally properly conductive copper), through the interface structure 148 and towards a heat dissipation body 162. The heat dissipation body 162, which may be made of a highly thermally conductive material such as copper or aluminum, has a base body 164 directly connected to the interface structure 148 and has a plurality of cooling fins 166 extending from the base body 164 and in parallel to one another so as to remove the heat towards the environment.

Construction and function of encapsulant 100 can be for instance as illustrated in and described referring to FIG. 1 and will be explained in the following in further detail. The encapsulant 100 of FIG. 3 is a mold compound-type composite. As shown in details 141, 143 of FIG. 3, composite encapsulant 100 comprises a matrix 108 of epoxy resin and filler particles 104, 106 in the matrix 108. Some or all of the filler particles 104, 106 are solid spheres. Depending on their function, they may have a different shape and/or may be hollow or porous.

The illustrated semiconductor package encapsulant 100 encapsulates the functional bodies 112, i.e. semiconductor component 110 with its metallic pad 160, leadframe-type metallic chip carrier 114, and bond wire-type electrically conductive connection element 116 partially or entirely. Filler particles 104 of the semiconductor package encapsulant 100 provide a corrosion protection function to the metallic surfaces of the functional bodies 112. This corrosion protection function may be provided by the metal activated inorganic filler particles 104, which are here embodied as calcium ion exchanged silica filler particles. As shown in detail 141 of FIG. 3, the metal activated inorganic filler particles 104 comprise an inorganic core 118 made of silica and metal ions 120 embodied as calcium on the inorganic core 118. In the way as described above referring to FIG. 1, calcium atoms or ions of the metal activated inorganic filler particles 104 are configured for trapping corrosive ions (such as protons or chloride ions) by an ion exchange mechanism, to thereby disable corrosion by said trapped ions.

Apart from this, the metal activated inorganic filler particles 104 are configured as flocculating agent forming aggregates 122 on the metallic surfaces of the functional bodies 112, as shown by detail 143 for the example of the bond wire-type electrically conductive connection element 116. Corresponding aggregates 122 may be formed on the chip pad(s) and/or on the chip carrier 114 (not shown). For instance, complexes of $CaSiO_3$ and $Fe_2(SiO_3)_3$ may form a protective layer in form of aggregates 122 on the metallic surfaces of the functional bodies 112. Such a protective layer may cause a second anticorrosion effect. In addition to its anticorrosive effect, in particular the inorganic material of the filler particles 104 may provide a filler function, such as reduction of the coefficient of thermal expansion.

Apart from this, further filler particles 106 may be provided for adding one or more further filler functions, such as a further reduction of a coefficient of thermal expansion, a further increase of thermal conductivity and/or a further reduction of density. For instance, said further filler particles 106 may be made of aluminium nitride.

FIG. 4 illustrates a cross-sectional view of a semiconductor package 110 with a semiconductor component 102 encapsulated by potting according to another exemplary embodiment. Thus, FIG. 4 illustrates a semiconductor package encapsulant 100 embodied as potting compound. The semiconductor package 110 of FIG. 4 can be a power package.

The shown semiconductor package 110 is mounted with a mounting structure 132 being embodied as printed circuit board (PCB). Semiconductor package 110 is mounted at its mounting interface on the mounting structure 132 with a sealing 158 in between. Preferably, the gas flow-inhibiting sealing 158 may establish a gas flow-tight connection between semiconductor package 110 and mounting structure 132.

The semiconductor package 110 comprises a semiconductor component 102, such as a power semiconductor chip, for instance comprising a field effect transistor (FET). Semiconductor component 102 has metallic pads 160. Semiconductor component 102 with its metallic pads 160 forms a functional body 112 which can be protected against corrosion by an appropriate choice of semiconductor package encapsulant 100.

An enclosure 174 encloses the semiconductor component 102 and defines a module interface at which the semiconductor package 110 is to be mounted on the mounting structure 132. In the shown embodiment, the enclosure 174 is composed of two parts. A first or interior part of the enclosure 174 is embodied as a soft encapsulant 100 (for instance made of a silicone gel and comprising filler particles 104, 106) which directly encapsulates the semiconductor component 102 with physical contact, for instance is applied by potting. A second or exterior part of the enclosure 174 is embodied as a rigid casing or housing 172 which may be made of plastic and accommodates the semiconductor component 102 and the soft encapsulant 100.

Furthermore, vertically extending electrically conductive needles 180 may be provided which electrically couple the semiconductor component 102 and the carrier 114 with an exterior of the semiconductor package 110, more precisely with the mounting structure 132. The needles 180 may also extend through the mounting structure 132. More precisely, bottom ends (according to FIG. 4) of the needles 180 may be connected at an upper main surface of the carrier 114. Furthermore, top ends (according to FIG. 4) of the needles 180 may be guided through the mounting structure 132 and may even protrude beyond the upper side of the mounting structure 132.

As shown as well in FIG. 4, the semiconductor package 110 comprises carrier 114 carrying the semiconductor component 102. The semiconductor component 102 may be soldered on the carrier 114. In the shown embodiment, the carrier 114 comprises a central thermally conductive and electrically insulating plate (for instance made of a ceramic) covered on both opposing main surfaces thereof with a respective electrically conductive layer (such as a continuous or patterned copper or aluminium layer). For instance, the carrier 114 may be a Direct Copper Bonding (DCB) substrate or a Direct Aluminium Bonding (DAB) substrate. It is also possible to embody the carrier 114 as Active Metal Brazing (AMB) substrate. The semiconductor component 102 is mounted on the top-sided electrically conductive layer. The bottom-sided electrically conductive layer may be connected to a heat sink (not shown) for promoting heat removal out of the semiconductor package 110 during operation thereof.

Thus, the outer layer of the carrier 114 is configured for mounting a heat sink (not shown) thereon in order to efficiently remove heat out of the semiconductor package 110, which is generated by semiconductor component 102 mounted on the interior layer of the carrier 114. Said semiconductor component 102 may, for instance, be a power semiconductor chip. Electric connection of the semiconductor component 102 can be accomplished by the carrier 114 (in particular by the inner electrically conductive layer thereof) and by electrically conductive connection elements 116 connecting the carrier 114 with the pads 160 on an upper main surface of the semiconductor component 102. Said electrically conductive connection elements 116 are here embodied as bond wires, but may alternatively be bond ribbons or clips.

As shown as well, the semiconductor component 102 mounted on the carrier 114 is enclosed within the enclosure 174, which is composed of soft encapsulant 100 and wall of housing 172.

The semiconductor package 110 further comprises a further gas flow-inhibiting sealing 179 between the carrier 114 and the housing 172 of the enclosure 174.

The electrically conductive needles 180 extend from the carrier 114 through the encapsulant 100 and through sealing 108 at the module interface at which the semiconductor package 110 faces mounting structure 132. For instance, the semiconductor package 110 and the mounting structure 132 may be connected by screwing, soldering, sintering, gluing and/or mechanically pressing.

In the embodiment of FIG. 4, corrosion protected functional bodies 112 being all at least partially encapsulated by encapsulant 100 are semiconductor component 102 with its metallic pads 160, the interior metallic surface of carrier 114, the bond wire-type electrically conductive connection elements 116, and the encapsulated portions of the needles 180. By embodying the potting-type encapsulant 100 in a corresponding way as described above referring to FIG. 1 or FIG. 3 (however preferably based on silicone gel as matrix 108), metallic surfaces of said functional bodies 112 may be reliably protected against corrosion. Also according to FIG. 4, it may be preferred to embody metal activated inorganic filler particles 104 of encapsulant 100 as calcium ion exchanged silica filler particles.

Figure 5:
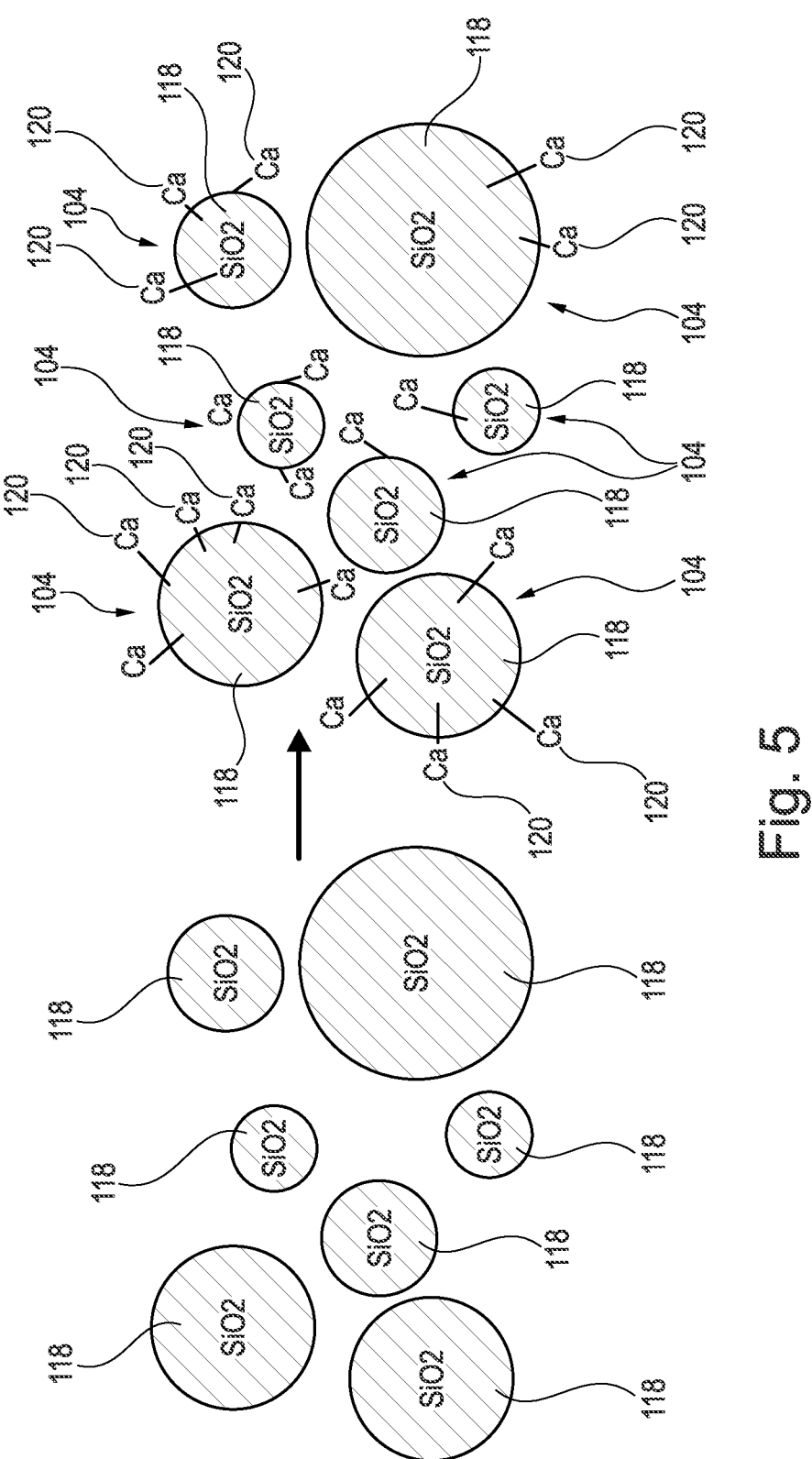
FIG. 5 illustrates cross-sectional views of structures obtained during carrying out a method of manufacturing a semiconductor package encapsulant according to an exemplary embodiment.

FIG. 5 illustrates cross-sectional views of structures obtained during carrying out a method of manufacturing a semiconductor package encapsulant 100 according to an exemplary embodiment.

FIG. 5 illustrates a process of creating metal activated inorganic filler particles 104, which are here embodied as calcium ion exchanged silica filler particles. Referring to the left-hand side of FIG. 5, silica particles are shown as inorganic cores 118 of the metal activated inorganic filler particles 104 to be manufactured. By an appropriate calcium treatment, in particular by supplying CaOH, an epoxy mold component-filler with calcium activation may be obtained, i.e. the metal activated inorganic filler particles 104 shown on the right-hand side of FIG. 5. Thus, a conventional mold-type encapsulant may be subjected to a silica exchange process for manufacturing metal activated inorganic filler particles 104 according to an exemplary embodiment.

It should be noted that the term "comprising" does not exclude other elements or features and the "a" or "an" does not exclude a plurality. Also elements described in association with different embodiments may be combined. It should also be noted that reference signs shall not be construed as limiting the scope of the claims. Moreover, the scope of the present application is not intended to be limited to the particular embodiments of the process, machine, manufacture, composition of matter, means, methods and steps described in the specification. Accordingly, the appended claims are intended to include within their scope such processes, machines, manufacture, compositions of matter, means, methods, or steps.

What is claimed is:

1. A semiconductor package encapsulant for at least partially encapsulating a semiconductor component, wherein the semiconductor package encapsulant comprises metal activated inorganic filler particles providing a corrosion protection function mixed with other filler particles providing at least one other function differing from said corrosion protection function, and wherein a percentage by weight of the metal activated inorganic filler particles, in relation to an entire weight of the semiconductor package encapsulant, is at least 4 weight percent.

2. The semiconductor package encapsulant according to claim 1, wherein a weight ratio between the metal activated inorganic filler particles and the other filler particles is in a range from 1:5 to 5:1.

3. The semiconductor package encapsulant according to claim 2, wherein a percentage by weight of a sum of the metal activated inorganic filler particles and the other filler particles, in relation to an entire weight of the semiconductor package encapsulant, is in a range from 70 weight percent to 90 weight percent.

4. The semiconductor package encapsulant according to claim 3, wherein the at least one other function comprises at least one of the group consisting of a moisture adsorption characteristic, a reduction of a coefficient of thermal expansion, a reduction of density, an enhancement of a high voltage capability, and an increase of thermal conductivity.

5. The semiconductor package encapsulant according to claim 1, configured as a mold compound, in particular as an epoxy-based mold compound.

6. The semiconductor package encapsulant according to claim 1, configured as a potting compound, in particular as a silicone gel-based compound.

7. The semiconductor package encapsulant according to claim 1, comprising a matrix in which the metal activated inorganic filler particles are embedded.

8. The semiconductor package encapsulant according to claim 1, wherein a percentage by weight of the metal activated inorganic filler particles, in relation to an entire weight of the semiconductor package encapsulant, is not more than 90 weight percent.

9. The semiconductor package encapsulant according to claim 1, wherein the metal activated inorganic filler particles comprise an inorganic ceramic.

10. The semiconductor package encapsulant according to claim 1, wherein the metal activated inorganic filler particles comprise an inorganic material selected from silica and alumina.

11. The semiconductor package encapsulant according to claim 1, wherein the metal activated inorganic filler particles comprise an alkaline earth metal.

12. The semiconductor package encapsulant according to claim 1, wherein the metal activated inorganic filler particles comprise at least one of the group consisting of calcium, magnesium, and zinc.

13. The semiconductor package encapsulant according to claim 1, wherein the metal activated inorganic filler particles comprise or consist of calcium exchanged silica.

14. The semiconductor package encapsulant according to claim 1, comprising at least one of the following features:

wherein the metal activated inorganic filler particles are configured for trapping ions by an ion exchange mechanism;

wherein the metal activated inorganic filler particles are configured as flocculating agent by forming aggregates; or wherein the metal activated inorganic filler particles comprise an inorganic core and metal ions on the inorganic core.

15. A semiconductor package, comprising:

at least one functional body including a semiconductor component; and a semiconductor package encapsulant according to claim 1 at least partially encapsulating the at least one functional body and providing a corrosion protection function to the at least one functional body.

16. The semiconductor package according to claim 15, wherein the at least one functional body further includes at least one of the group consisting of a carrier carrying the semiconductor component, and an electrically conductive connection element connecting the semiconductor component, in particular a clip and/or a bond wire.

17. A method comprising:

providing a semiconductor package encapsulant;

at least partially encapsulating a semiconductor component using the semiconductor package encapsulant;

wherein providing the semiconductor package encapsulant comprises providing metal activated inorganic filler particles in the semiconductor package encapsulant for providing a corrosion protection function in a semiconductor package mixed with other filler particles providing at least one other function differing from said corrosion protection function; and wherein a percentage by weight of the metal activated inorganic filler particles, in relation to an entire weight of the semiconductor package encapsulant, is at least 4 weight percent.

18. The method according to claim 17, wherein the method comprises using the metal activated inorganic filler particles in a semiconductor package encapsulant for at least partially encapsulating a semiconductor component in the semiconductor package.

* * * * *